US009146292B2

(12) United States Patent
Gumbrecht (10) Patent No.: US 9,146,292 B2
(45) Date of Patent: Sep. 29, 2015

(54) METHOD AND DEVICE FOR DETERMINING A MAGNETIC RESONANCE SYSTEM CONTROL SEQUENCE

(75) Inventor: Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 490 days.

(21) Appl. No.: 13/429,058

(22) Filed: Mar. 23, 2012

(65) Prior Publication Data

US 2012/0262170 A1 Oct. 18, 2012

(30) Foreign Application Priority Data

Mar. 25, 2011 (DE) .......................... 10 2011 006 149

(51) Int. Cl.
G01V 3/00 (2006.01)
G01R 33/561 (2006.01)
(52) U.S. Cl.
CPC .................................. *G01R 33/5612* (2013.01)
(58) Field of Classification Search
CPC .................................................. G01R 33/4616
USPC .......................... 324/314, 312, 309, 307, 300
See application file for complete search history.

(56) References Cited

U.S. PATENT DOCUMENTS

| 8,120,359 | B2 | 2/2012 | Diehl et al. | |
|---|---|---|---|---|
| 8,224,609 | B2* | 7/2012 | Griswold et al. | 702/106 |
| 8,542,013 | B2* | 9/2013 | Moβnang et al. | 324/309 |
| 8,779,769 | B2* | 7/2014 | Ritter | 324/309 |
| 2010/0141252 | A1 | 6/2010 | Fautz et al. | |
| 2010/0253336 | A1 | 10/2010 | Schneider et al. | |
| 2010/0327867 | A1 | 12/2010 | Diehl et al. | |

FOREIGN PATENT DOCUMENTS

| DE | 10 2008 061 455 A1 | 6/2010 |
|---|---|---|
| DE | 10 2009 002 112 B3 | 8/2010 |
| DE | 10 2008 029 175 B4 | 9/2010 |
| DE | 10 2009 025 476 A1 | 1/2011 |

OTHER PUBLICATIONS

German Office Action dated Mar. 14, 2012 for corresponding German Patent Application No. DE 10 2011 006 149.5 with English translation.
W. Grissom, et al., "Spatial Domain Method for the Design of RF Pulses in Multicoil Parallel Excitation," Magnetic Resonance in Medicine 56, pp. 620-629, 2006.
C. Paige, et al., "Algorithm 583 LSQR: Sparse Linear Equations and Least Squares Problems," ACM Transactions on Mathematical Software, vol. 8, No. 2, pp. 195-209, 1982.
C. Paige, et al., "LSQR: An Algorithm for Sparse Linear Equations and Sparse Least Squares," ACM Transactions on Mathematical Software, vol. 8, No. 1, pp. 43-71, 1982.
R. Gumbrecht, et al., "Improved Accuracy for Low-flip pTx Pulse Design by Accounting for the Finite Transmission Bandwidth of Continuous Pulses," p. 661, admitted prior art.

* cited by examiner

*Primary Examiner* — Louis Arana
(74) *Attorney, Agent, or Firm* — Lempia Summerfield Katz LLC (57) ABSTRACT

A method and a control sequence determination device for determining a magnetic resonance system control sequence is disclosed. The magnetic resonance system control sequence includes a multi-channel pulse with a plurality of individual high-frequency (HF) pulses to be transmitted in parallel by the magnetic resonance system via different independent high-frequency transmission channels. In one embodiment, the method includes calculating a multi-channel pulse based on an MR excitation quality parameter in an HF pulse optimization method. An HF pulse includes a plurality of successive HF partial pulses in discrete time steps. The method further includes considering, in the course of the HF pulse optimization method, a transmission bandwidth of an HF partial pulse to be transmitted during a discrete time step. A method for operating a magnetic resonance system and a magnetic resonance system that includes the control sequence determination device are disclosed.

17 Claims, 3 Drawing Sheets

METHOD AND DEVICE FOR DETERMINING A MAGNETIC RESONANCE SYSTEM CONTROL SEQUENCE

This application claims the benefit of DE 10 2011 006 149.5, filed Mar. 25, 2011.

BACKGROUND

The present embodiments relate to a method and a control sequence determination device for determining a magnetic resonance system control sequence that includes a multi-channel pulse with a plurality of individual high frequency (HF) pulses to be transmitted in parallel by the magnetic resonance system via different independent high-frequency transmission channels. A multi-channel pulse is calculated based on an MR excitation quality parameter in an HF pulse optimization method. In one embodiment, an HF pulse of the multi-channel pulse to be transmitted on a transmission channel includes a plurality of successive HF partial pulses in very short, discrete time steps. The present embodiments further relate to a method for operating a magnetic resonance system that includes a plurality of independent high-frequency transmission channels using such a magnetic resonance system control sequence. The present embodiments further relate to a magnetic resonance system that includes a plurality of independent high-frequency transmission channels and a control device configured to transmit, via the different high-frequency transmission channels, a multi-channel pulse having a plurality of parallel individual HF pulses in order to carry out a desired measurement based on a predetermined control sequence.

In a magnetic resonance system, the body to be examined is generally subjected to a relatively high main magnetic field via a main field magnetic system (i.e., the so-called $B_o$ field, of, for example 3 or 7 Tesla). Additionally, a magnetic field gradient is applied using a gradient system. Then, using suitable antenna devices, high-frequency excitation signals (HF signals) are transmitted via a high-frequency transmission system. The high-frequency transmission system is intended to cause the nuclear spins of specific atoms resonantly excited by the high-frequency field to be tilted in a spatially resolved manner by a defined flip angle relative to the magnetic field lines of the main magnetic field. The high-frequency magnetic field, which is transmitted in the form of individual pulses or pulse trains, may be denoted as the $B_1$ field. Magnetic resonance excitation (MR excitation) using magnetic high-frequency pulses and/or the resulting flip angle distribution is referred to hereinafter as nuclear magnetization or "magnetization" for short. During the relaxation of the nuclear spins, high-frequency signals (so-called magnetic resonance signals), are emitted. The high-frequency signals are received by suitable receiver antennas and are then processed further. The desired image data may then be reconstructed from the acquired raw data. The high-frequency signals for the nuclear spin magnetization are generally transmitted by or using a so-called "whole body coil" or "bodycoil." A typical design of a body coil is a birdcage antenna, which consists of a plurality of transmission rods that are arranged to extend parallel to the longitudinal axis around a patient area of the tomograph in which a patient is located during the examination. On the front face, each of the antenna rods are capacitively connected together in an annular manner. The magnetic resonance signals are generally received by local coils in the vicinity of the body, but may, alternatively or additionally, be received by the bodycoil. The local coils are frequently used for transmitting MT excitation signals.

Hitherto, it was typical to operate whole body antennas in a "homogenous mode" (e.g., a "CP mode"). Accordingly, a single temporal HF signal is provided with a defined fixed phase and amplitude ratio relative to all components of the transmission antennas, such as, for example, all transmission rods of a birdcage antenna. In more modern magnetic resonance systems, it has become possible to provide the individual transmission channels (e.g., the individual rods of a birdcage antenna) with individual HF signals. Accordingly, a multi-channel pulse is transmitted which, as described above, includes a plurality of individual high-frequency pulses. The individual high-frequency pulses may be transmitted in parallel via the different independent high-frequency transmission channels. Because the individual pulses are transmitted in parallel, a multi-channel pulse (i.e., the pTX pulse") is formed. The multi-channel pulse may, for example, be used as an excitation, refocusing and/or inversion pulse. An antenna system that includes a plurality of independently controllable antenna components and/or transmission channels is often also denoted as "transmit array," regardless of whether the transmit array is a whole body antenna or an antenna array in the vicinity of the body.

Such pTX pulses and/or pulse trains, which are constructed therefrom, are determined for a specific planned measurement. This is usually done in advance by establishing the pulse shape and phase of the pulses that are to be transmitted on the individual transmission channels. As a result, the HF pulses for the individual transmission channels are determined over time, as a function of a "transmission k-space gradient trajectory, in an optimization method. The "transmission k-space gradient trajectory" ("gradient trajectory"), is generally predetermined by a measurement protocol. The gradient trajectory refers to the coordinates in the k-space that are reached by setting the individual gradients at specific times, or, in other words, the coordinates in the k-space that are reached using gradient pulse trains (with appropriate x-, y- and z-gradient pulses) to be transmitted in a coordinated manner that is appropriate for each of the HF pulse trains. The k-space is the spatial frequency domain and the gradient trajectory in the k-space describes the path on which the k-space is traversed in terms of time when an HF pulse and/or the parallel pulses are transmitted by a corresponding switching of the gradient pulses. By setting the gradient trajectory in the k-space (i.e. by setting the appropriate gradient trajectory applied in parallel with the multi-channel pulse train), the spatial frequencies at which specific HF energies are deposited may be determined.

When planning the HF pulse sequence, the user specifies an MR excitation quality parameter (e.g., a parameter in the form of a target magnetization). The user may, for example, specify a desired spatially resolved flip angle distribution that is used as a reference value within a target function. In an optimization program, the appropriate HF pulses are thus calculated for the individual channels, such that the specified MR excitation quality parameter is achieved. The MR excitation quality parameter is based on the Bloch equation:

$$\frac{dm}{dt} = \gamma \cdot m \times B \tag{1}$$

The Bloch equation generally describes the magnetization structure by a magnetization vector m in a magnetic field B, where γ is the gyromagnetic ratio of the core to be excited (for the generally excited hydrogen γ=42.58 MHz/T).

As noted above, the pulse shape is generally calculated so that a pulse with a specific length is discretized in a number of very short time steps. Typically, the time steps are of a 1 to 10 μs duration. A HF pulse of, for example, 10 to 20 ms duration thus contains over 1000 time steps. Within each time step, it may be roughly assumed that the pulse value of the HF pulse to be transmitted is constant. For small flip angles (e.g., flip angles below ca. 5°) the Bloch equation may, as a result, be described by a linear approximation based on an approximation of the first-order Taylor approximation:

$$m = J \cdot b \quad (2)$$

In equation (2), m represents the vector of the spatially discretized (transverse) magnetization, J represents the Jacobi matrix of the magnetization m, and the vector b represents the temporal discretization of the HF pulses, i.e., $b=(b_1, b_2, \ldots, b_j, \ldots, b_n)$, where $b_j$ is a pulse value at the time and/or in the time step $j=1, \ldots, n$. The pulse values are generally complex and each pulse contains a real and imaginary part which represent the voltage amplitude and the phase of the HF pulse. The elements $a_{ij}$ of the Jacobi matrix J may, according to Grissom et al., "Spatial Domain Method for the Design of RF Pulses in Multicoil Parallel Excitation," Mag. Res. Med. 56, 620-629, 2006, be approximately described by the equation $$a_{ij} = i\gamma \Delta t e^{i\gamma \Delta B_0(x_i)(t_j-T)} e^{ix_i k_j} \quad (3),$$

where $x_i$ represents the local vector of a voxel with the index i of an excitation volume, $k_j$ represents the location frequency vector in the k-space at the time step j, $\Delta B_0$ represents the local deviation of the magnetic field from the desired $B_0$ field at the location $x_i$, $t_j$ represents the time for the discrete time step j, and T represents the total pulse length. The letter i, which is not in the index, represents the usual imaginary unit.

The solution of the linear equation system defined in such a manner thus provides, for each of the time steps j=1, . . . n, a complex pulse value and, in turn, the voltage amplitude and the phase of the pulse in this time step for the control of the magnetic resonance system.

Generally, the solution is approximated as much as possible in an optimization method with a target function that is to be minimized and that corresponds to equation (2). The pulse values for the individual time steps of the pulses are thus the degrees of freedom and/or variables of the target function to be optimized. When using an LSQR optimization method (see, for example, C. C. Paige and M. A. Saunders, "LSQR: an algorithm for sparse linear equations and sparse least squares," TOMS 8(1), 43-71 (1982), or C. C. Paige and M. A. Saunders, Algorithm 583; "LSQR: Sparse linear equations and least square problems," TOMS 8(2), 195-209 (1982) the target function may, for example, be expressed as follows:

$$\min \|m - m_{des}\|_2^2 = \min \|J \cdot b - m_{des}\|_2^2 \quad (4),$$

where $m_{des}$ is the desired target magnetization. The value of a vector is, in equation (4), understood in terms of components. The norm selected here is, as an example, the Euclidian norm ($L_2$-norm). If a further optimization algorithm (e.g., a magnitude least square method (MLS method) is used, a similar target function adapted to the method is used.

For a specific measurement, the different multi-channel pulses and/or pulse trains of the pulses are thus determined, the gradient pulse trains belonging to the respective control sequence and further control parameters are defined in a so-called measurement protocol. The measurement protocol is produced in advance and may be retrieved from a memory, for example, for a specific measurement, and optionally modified by the operator. During the measurement process, the magnetic resonance system is automatically and fully controlled based on this measurement protocol. The control device of the magnetic resonance system reads out the commands from the measurement protocol and processes the commands. The calculated pulse shapes are thus initially generated, in digital form, in a small signal generator of the respective transmission channel. The pulse shapes are subsequently converted into an analog signal and boosted using a high-frequency booster, such that a sufficiently high transmission pulse with the desired pulse shape is present. The pulse may then be stored in the antenna element belonging to the respective transmission channel.

Locating the optimal pulse b in order to achieve, as easily as possible, a specific target magnetization, results in a more complex computation, as more free variables have to be solved within the optimization problem according to equation (4). For example, the number of time steps required to generate a pulse of a specific temporal length T may substantially increase the complexity of the computation. Typically, time steps of between 1 and 10 μs duration are used, such that a pulse of, for example, 10 to 20 ms duration contains approximately 1000 to 2000 time steps. Consequently, in an optimization method for a multi-channel pulse for a magnetic resonance system with eight independent transmission channels, 8000 to 16000 variables are simultaneously be considered. As the number of transmission channels increases, the number of variables also increases. In turn, the required computing time increases proportionally as well.

One possibility for reducing the number of degrees of freedom would be to make the time steps longer. However, it has been shown that, when the time steps are lengthened and the optimal pulses are located using the above-described linear approximation, the subsequent transmission of the pulses no longer results in the desired magnetization. Thus, by lengthening the time steps, it is no longer possible to utilize a linear equation system. Instead, pulse calculation methods that are more complex and, thus, more time-consuming to compute would have to be used. Additionally, in practice, it has been shown that the above-described linear method is no longer sufficiently accurate when higher gradient field strengths are present. On the other hand, it is advantageous to use higher gradient field strengths because this allows the k-space to be transmited more rapidly and may allow for a shorter measuring time.

SUMMARY AND DESCRIPTION

The present embodiments may obviate one or more of the drawbacks or limitations in the related art. For example, a method and a corresponding control sequence determination device for determining magnetic resonance system control sequences may be provided that are more suitable for tackling the above-described problem.

In one embodiment, a method may be provided in which a multi-channel pulse is calculated, based on a specified MR excitation quality (e.g., a target magnetization) in an HF pulse optimization method. An HF pulse, which is transmitted on a transmission channel of the system as part of the multi-channel pulse, includes a plurality of very short partial pulses. In other words, the HF pulse includes a plurality of time steps of a defined length Δt. Unlike known methods, in this embodiment, a transmission bandwidth of an HF partial pulse, which is to be subsequently transmitted during a discrete time step, is considered during the HF pulse optimization method. The present embodiments are thus based on the recognition that a calculation of an HF pulse, in the form of a plurality of successive HF partial pulses in discrete time steps, according to the above approximations becomes problematic because each of the successive HF partial pulses, which are short but nevertheless last a specific length Δt, also has a limited transmission bandwidth. If this transmission bandwidth, which changes with the length Δt, is consideredor calculated using an approximate linear method, the number of time steps and, thus, the number of free variables may be reduced in the optimization method without causing a significant deterioration in the optimization result. The consideration of the transmission bandwidth in the optimization method may also be perceived as positive, particularly when starting from higher gradient field strengths, so that the measurement may be accelerated. Possibilities for considering or calculating the transmission bandwidth within the HF pulse optimization method are described in more detail below.

Accordingly, in one embodiment, a control sequence determination device includes an input interface for detecting an MR excitation quality parameter and an HF pulse optimization unit operative to calculate a multi-channel pulse based on the MR excitation quality parameter in an HF pulse optimization method. The control sequence determination device further includes a control sequence output interface operative to either (i) transfer to a control device the control sequence for controlling the magnetic resonance system for data acquisition, or (ii) store the data in a memory for that purpose. The control sequence determination device is operative to consider, in the HF pulse optimization method, the transmission bandwidth of an HF partial pulse to be transmitted during a discrete time step.

In one embodiment of a method for operating a magnetic resonance system, a control sequence is determined. The magnetic resonance system is then operated by using the control sequence. In another embodiment, a magnetic resonance system may include a control sequence determination device for determining the control sequence.

Components of the control sequence determination device, particularly the HF pulse optimization unit, may be configured as software components. The input interface may, for example, be a user interface (e.g., a graphic user interface) for manual input of an MR excitation quality parameter. The input interface (e.g., the user interface) may also be used to select and adopt data (e.g., a target magnetization) from a data memory arranged within the control sequence determination device or connected thereto via a network. The control sequence output interface may be, for example, an interface which transfers the control sequence to a magnetic resonance controller in order to thereby directly control the measurement. The control sequence output interface may also transmit the data via a network and/or store the data in a memory for subsequent use. In other embodiments, the input and/or output interfaces may be partially configured as a software component and may utilize hardware interfaces of a computer that is present.

In one embodiment, a computer program, which includes program code sections executable by a processor, may be loaded directly into a memory of a control sequence determination device. When the program is executed in the control sequence determination device, all of the steps of the methods described herein may be performed. Such a software-based implementation is advantageous because it allows devices previously used to determine control sequences (e.g., suitable computers in computer centers of the magnetic resonance system manufacturers) to be modified, by implementing the program in a suitable manner, such that less computing effort is necessary and/or more rapid control sequences are produced.

The present embodiments are based on the fact that an HF pulse, during each time step, has a substantially constant value (except for the usual tolerances). In other words, the HF pulse has, during each time step, a constant amplitude and, in some cases, a constant phase. Accordingly, it is assumed that the individual HF partial pulses, of which together form a whole HF pulse, are substantially short square pulses.

The disclosed method is operative during the course of HF pulse optimization, as explained above, with a linear approximation of the Bloch equation in order to describe a transverse magnetization that may be achieved by a multi-channel pulse. In one embodiment, a target function, in which the magnetization is represented by, preferably, a first order Taylor approximation of the Bloch equation at the zero point, is used.

In one embodiment, the transmission bandwidth may be incorporated into the target function of the HF pulse optimization method, such that matrix elements of a Jacobi matrix used in the Taylor approximation are each formed using a correction factor that represents the transmission bandwidth in a defined time step for a defined spatial magnetization location (i.e. a specific voxel in the excitation volume). In other words, the matrix elements $a_{ij}$ of the Jacobi matrix J in the equation (2), above, are now no longer described by the equation (3), above, but instead are described by the following equation:

$$a_{ij} = C_{ij} \cdot i\gamma \Delta t e^{i\gamma \Delta B_0(x_i)(t_j - T)} e^{i x_i k_j} \tag{5}$$

Equation (5) differs from the equation (3) only by the additional correction factor $C_{ij}$, which considers or accounts for the transmission bandwidth.

The correction factor $C_{ij}$, may be calculated using the following equation:

$$C_{ij} = \frac{2\sin\lfloor((x_i g_j) + \Delta B_0(x_i)) \cdot \gamma \Delta t / 2\rfloor}{((x_i g_j) + \Delta B_0(x_i)) \cdot \gamma \Delta t}, \tag{6}$$

where $x_i$ represents the local vector of a voxel i of an excitation volume, $g_j$ represents the magnetic field gradient for the time step j, Δt represents the temporal length of a discrete time step, and $\Delta B_0$ represents the local deviation of the magnetic field, from the desired $B_0$ field, at the location $x_i$, $x_i g_i$ is the scalar product of the local vector $x_i$ with the magnetic field gradient vector $g_j$, and, thus, represents the value of the magnetic field generated by the gradients $B_z$ in the z direction at the location $x_i$.

As explained further below, excellent optimization results may be obtained by using the correction factor $C_{ij}$ described in the equation (5) within the elements $a_{ij}$ of the Jacobi matrix J, even when longer time steps are used. Accordingly, the number of variables for optimization at the same pulse length is reduced.

Using the disclosed method, the same or similar parameters obtained using previous methods may be obtained for calculating the magnetic resonance system control sequence. In other words, the MR excitation quality parameter and/or target magnetization and the transmission k-space gradient trajectory may be predetermined in the same manner as described above.

Additionally, further input data may be used in order to achieve an optimal result. In particular, a current $B_0$ map, which is a board that represents the homogeneity of the $B_0$ field in a specific field in which the excitation is intended to take place, and, for each transmission channel, a respective current $B_i$ map, which for the relevant transmission channel represents the $B_1$ field strength in the relevant field, are predetermined as input data in the HF pulse optimization method. In one embodiment, the boards may be previously recorded as test measurements with the current object to be examined and/or patient in the current device. To this end, one embodiment of a control sequence determination device includes a corresponding input interface, so that the device may adopt this $B_0$ map and/or $B_i$ maps.

In the disclosed method, HF pulses for greater flip angles may also be determined. In one embodiment, the multi-channel pulses are calculated during the HF pulse optimization method, as noted above, for a lower initial target magnetization. The determined multi-channel pulse is then scaled up to a final target magnetization. Errors which may occur during scaling may be determined and corrected, for example, within a (Bloch) simulation.

Moreover, additional parameters may influence the HF pulse optimization, for example within the Thikhonov regularization, in order to achieve even better results. Moreover, during the optimization additional restrictions, such as parameters for the maximum high frequency loading of a patient, which are generally predetermined by one or more SAR limit values (SAR=Specific Absorption Rate) or SED limit values (SED=Specific Energy Dose), may considered or taken into account.

DETAILED DESCRIPTION OF THE DRAWINGS

Figure 1:
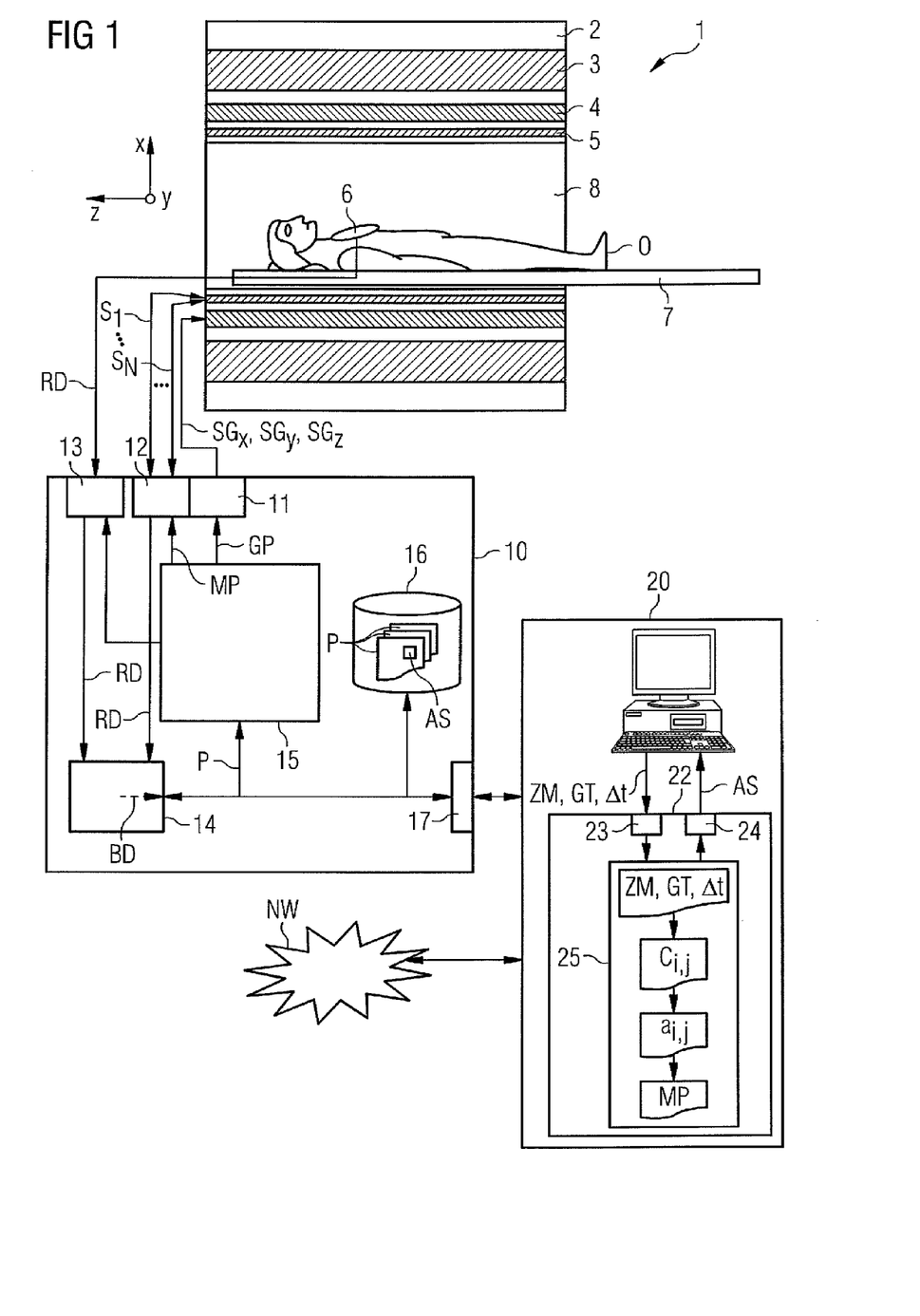
FIG. 1 shows a schematic representation of one embodiment of a magnetic resonance system.

In FIG. 1, a magnetic resonance system 1 is shown. The magnetic resonance system 1 includes a magnetic resonance scanner 2 with an examination area 8 and/or patient tunnel 8 located therein. A couch 7 may be moved into this patient tunnel 8, so that a patient O or subject lying thereon during an examination may be placed at a specific position, relative to the magnet system and high frequency system arranged therein, within the magnetic resonance scanner 2 and/or may be moved between different positions during a measurement process.

The magnetic resonance scanner 2 includes a main field magnet 3, a gradient system 4 having magnetic field gradient coils configured to apply any magnetic field gradients in the x-, y-, and z-directions, and a whole body high-frequency coil 5. The magnetic resonance signals induced in the object to be examined O may be received by the whole body coil 5. The whole body coil 5 may also be used to transmit the high frequency signals for inducing the magnetic resonance signals. The high frequency signals are received by local coils 6 placed, for example, on or below the object to be examined O.

The whole body high-frequency coil 5 is, in this embodiment, constructed in the form of a so-called birdcage antenna and includes a number N of individual antenna rods that extend parallel to the patient tunnel 8 and are arranged, in an even distribution, on a circumference around the patient tunnel 8. Each of the individual antenna rods are, at their ends, capacitively connected in an annular manner.

The antenna rods may be separately controlled as individual transmission channels $S_1, \ldots, S_N$ by a control device 10. The control device 10 may be a control computer which may, in one embodiment, include a plurality of individual computers that may, for example, be spatially separated and interconnected via suitable cables or the like. The control device 10 is connected to a terminal 20 via a terminal interface 17. An operator may, control the entire system 1 via or using the terminal interface 17. In this embodiment, the terminal 20 is provided as a computer with a keyboard, one or more screens, and further input devices, such as, for example, a mouse or the like, so that a graphic user interface is available to the operator.

The control device 10 includes, among other things, a gradient control unit 11. The gradient control unit 11 may include a plurality of subcomponents. Via this gradient control unit 11, the individual gradient coils are allocated to gradient control signals $SG_x$, $SG_y$, $SG_z$. In this embodiment, the control signals are gradient pulses which are set, during a measurement process, at precisely designated chronological positions and with a precisely predetermined time curve.

The control device 10 further includes a high-frequency transmission/receiver unit 12. The HF transmission/receiver unit 12 also includes a plurality of subcomponents, so that the unit 12 may separately apply, in parallel, high frequency pulses to the individual transmission channels $S_1, \ldots S_N$ (i.e. to the individually controllable antenna rods of the bodycoil). Magnetic resonance signals may also be received via the transmission/receiver unit 12. Generally, however, the local coils 6 receive the magnetic resonance signals. The raw data RD received by the local coils 6 are read out and processed by an HF receiver unit 13. The magnetic resonance signals received by the local coils 6 or by the whole body coil using or via the HF transmission/receiver unit 12, are transmitted as raw data RD to a reconstruction unit 14. The reconstruction unit 14 reconstructs the image data BD from the raw data RD and stores the image data BD in a memory 16 and/or transmits the image data BD to the terminal 20 via the interface 17 so that the image data BD may be studied by the operator. The image data BD may also be stored and/or displayed and evaluated at other locations via a network NW.

The gradient control unit 11, the HF transmission/receiver unit 12 and the receiver unit 13 for the local coils 6 are each controlled in a coordinated manner by a measuring control unit 15. The measuring control unit 15 ensures, using corresponding commands, that a desired gradient pulse GP is transmitted by suitable gradient control signals $SG_x$, $SG_y$, $SG_z$ and controls, in parallel, the HF transmission/receiver unit 12 so that one or more multi-channel pulses MP (generally a multi-channel pulse train having a plurality of multi-channel pulses MP) is transmitted (i.e. that on the individual transmission channels $S_1, \ldots S_N$ the appropriate high frequency pulses are provided, in parallel, to the individual transmission rods of the whole body coil 5). This also ensures that, at a suitable time, the magnetic resonance signals received by the local coils 6 are read out and processed by the HF receiver unit 13 and/or signals received by the whole body coil 5 are read out and processed by the HF transmission/receiver unit 12. The measuring control unit 15 predetermines the corresponding signals, particularly the multi-channel pulses MP to the high frequency transmission/receiver unit 12 and the gradient pulses GP to the gradient control unit 11, according to a predetermined control protocol P. All control data which have to be set during a measurement process are stored in this control protocol P.

Generally, a plurality of control protocols P for different measurements are stored in a memory 16. The measurements may be selected and, optionally, varied by the user via the terminal 20 in order to provide a suitable control protocol P for the currently desired measurement that the measurement unit 15 is able to operate. Moreover, the operator may also retrieve, via a network NW, control protocols P from, for example, a manufacturer of the magnetic resonance system 1, and may, optionally, modify and use the retrieved control protocols.

The basic sequence of such a magnetic resonance measurement process and the aforementioned components for controlling such as process are, however, known, so that they will not be discussed in further detail here. In other embodiments, the magnetic resonance scanner 2 and/or the corresponding control device 10 may include a plurality of further components which are not explained in detail herein.

The magnetic resonance scanner 2 may, in other embodiments, be of a different construction. The scanner 2 may, for example, include a patient space which is open at the sides. Likewise, the high frequency whole body coil need not be designed or constructed as a birdcage antenna. The whole body coil need only include a plurality of separately controllable transmission channels $S_1, \ldots, S_N$, and the control device 10 need only, using the high frequency transmission/receiver device, have a corresponding number of channel controls available in order to be able to separately control the individual transmission channels $S_1, \ldots, S_N$.

In the embodiment depicted in FIG. 1, a control sequence determination device 22 is shown. The determination device 22 determines a magnetic resonance system control sequence AS. The magnetic resonance system control sequence AS contains, among other things, for a specific measurement process, one or more predefined multi-channel pulses MP for controlling the individual transmission channels $S_1, \ldots, S_N$. The magnetic resonance system control sequence AS in this embodiment is set up as part of the measuring protocol P.

The control sequence determination device 22 shown in FIG. 1 is part of the terminal 20 and may be implemented as software components on the computer of the terminal 21. In other embodiments, however, the control sequence determination device 22 may also be part of the control device 10 itself or may be implemented on a separate computer system, in which case the completed control sequences AS, which may be within the context of a complete control protocol P, are transmitted via a network NW to the magnetic resonance system 1.

The control sequence determination device 22 in this embodiment includes an input interface 23. Via this input interface 23, the control sequence determination device 22 first obtains an MR excitation quality parameter (e.g., a target magnetization ZM that predetermines the intended flip angle distribution during the desired measurement). Moreover, via this interface 23, further input values may also be predetermined, as already described above, such as, for example a k-space gradient trajectory GT, a parameter for the length Δt of the discrete time steps of an HF pulse (hereinafter also referred to as "sampling time" Δt), a $B_0$ map, the $B_1$ maps, etc. The parameters may, for example, be obtained by an expert who is accordingly qualified to develop control protocols for specific measurements. To this end, the parameters may also be already predetermined in a control protocol. For determining the control sequence, the corresponding data are adopted from the control protocol in order to generate, therefrom, the multi-channel pulse MP and to be used for the following measurement on the current device with the current patient.

This makes sense insofar as the $B_0$ map and the $B_1$ map are measured for the respective current patient O in the previous alignment and test measurements.

The obtained data are then transmitted to an HF pulse optimization unit 25, which automatically sets a specific control sequence AS with the optimal multi-channel pulse MP for achieving the desired target magnetization ZM (and/or a complete multi-channel pulse train with a plurality of multi-channel pulses).

The data may then be output again via a control sequence output interface 24 and, for example, within the context of a control protocol P, in which further parameters for controlling the magnetic resonance system 1 are provided (e.g., parameters for the reconstruction of the images from the raw data, etc.). The data may then be transmitted to the control device 10.

Figure 2:
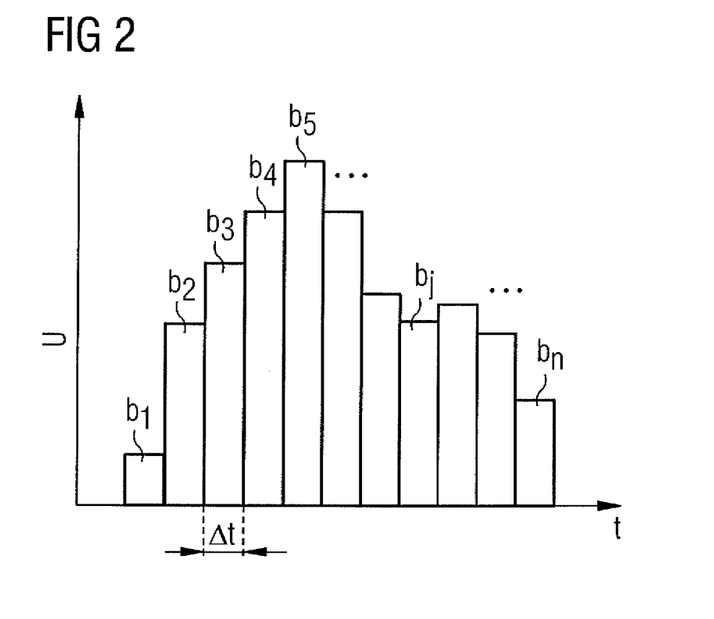
FIG. 2 shows a schematic representation of an HF pulse for a transmission channel formed from a plurality of successive HF partial pulses in discrete time steps.

A high frequency pulse of a determined multi-channel pulse MP, includes a plurality of short successive square pulses with a length Δt (generally a length of 5 to 10 μs). This is shown by way of example in FIG. 2. In FIG. 2, only the value of the voltage amplitude U of the respective partial pulse is shown over time t. The individual partial pulses are denoted by $b_1, b_2, \ldots, b_j, \ldots, b_n$. The pulse b may be ultimately represented as the vector $b=(b_1, b_2, \ldots, b_j, \ldots, b_n)$, wherein the vector b overall contains 1000 to 2000 vector elements in order to achieve a total pulse length of 10 to 20 ms. Such a "pulse vector" b is determined in an optimization method, as described above using equations (2) to (4).

As also set forth above, problematically, the individual partial pulses have a specific temporal length Δt and, thus, also a defined bandwidth that is predetermined by the Fourier Transform of the square pulse. Known calculation methods, described according to the equations (3) and (4), do not, however, consider this or take this into account. If the selected sampling time Δt is too large, a theoretically optimal pulse may be obtained with the optimization method using the conventional linear approximation, but these determined optimal pulses, do not, in reality, lead to the desired result.

Figure 4:
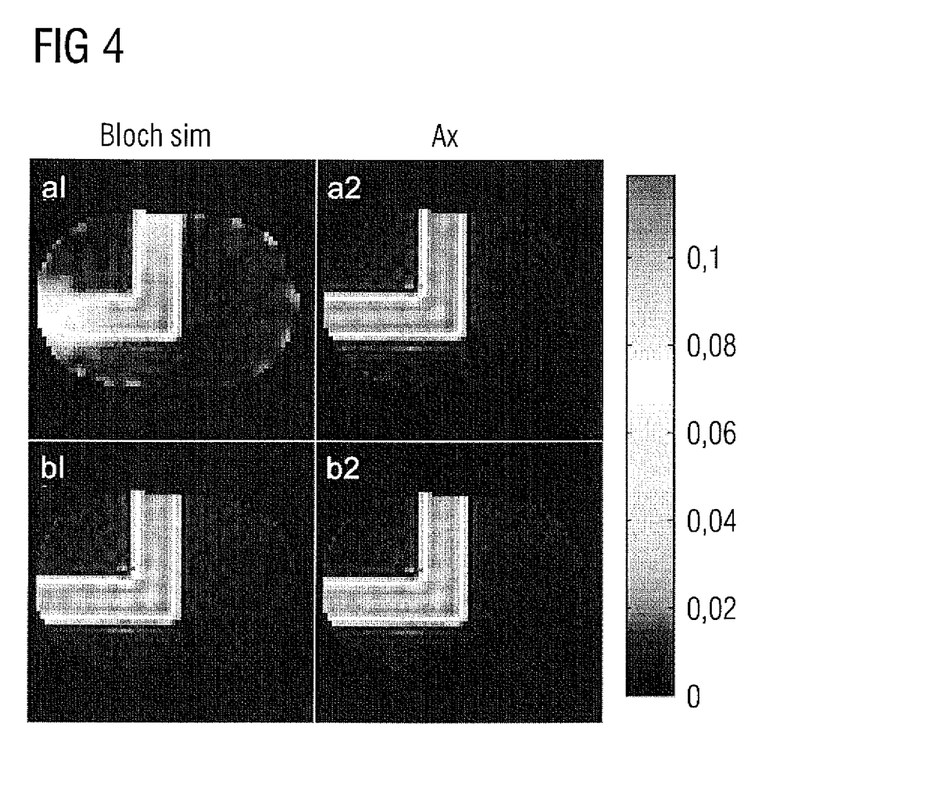
FIG. 4 shows different magnetization boards for comparing the disclosed method with a known method.

This may be shown using FIG. 4. In this figure, four different magnetization patterns (magnetization boards a1, a2, b1, b2) of the transverse magnetization for pTx pulses are shown. Generally, such a magnetization board is color scaled (in this case gray-scaled) and the parameter scale is shown in the form of a color scale (in this case a gray scale) directly adjacent to the card.

The magnetization board 2a shows the magnetization, which should be achievable using HF pulses, which has been used by an LSQR algorithm in an optimization method according to the equation (4), wherein the Bloch equation has been described according to equations (2) by a first order Taylor approximation with a Jacobi matrix, and the elements thereof have been calculated according to the equation (3) (i.e. the elements have been calculated without a correction factor that accounts for or considers the transmission bandwidth of the partial pulses of an HF pulse). In this case, a spiral gradient trajectory has been used in order to cover the k-space as effectively as possible. The peak gradient amplitude for this calculation was 10 mTesla/m. The sampling time Δt has been set at 20 μs, i.e. twice as long as the previous usual maximum. A calculation using the conventional linear approximation would then lead to the desired magnetization pattern in the magnetization board a2, as shown in FIG. 4.

However, if the determined HF pulses are used to monitor, in a more complex Bloch simulation, the effect in a real transmission of these HF pulses, the image shown in the magnetization board a1 of FIG. 4 is produced. It shows, therefore, that HF pulses obtained in the course of the linear approximation are incorrect, particularly in regions in which high gradient fields may be expected (i.e. in boundary regions on the left side of the magnetization card). In this regard, therefore, it would no longer be expedient to use a linear approximation of the Bloch equation in the optimization method with such long sampling times Δt of 20 μs.

If, however, the equation (3) is modified in the manner shown in the equation (5) by incorporating, depending on the location and time, a correction factor $C_{ij}$ (calculated, for example, using equation (6)), this problem may be eliminated (assuming that the optimization method is otherwise unaltered) This method is shown schematically in FIG. 1 in the HF pulse optimization unit 25. The HF pulse optimization unit 25 initially determines, using the predetermined target magnetization ZM, the gradient trajectory GT and the sampling time Δt. The optimization unit 25 determines further data, the correction factors $C_{ij}$, and, using the determined correction factors $C_{ij}$, determines the elements $a_{ij}$ of the Jacobi matrix J. This is then used in a target function according to equation (4) to determine the optimal multi-channel pulse MP.

Figure 3:
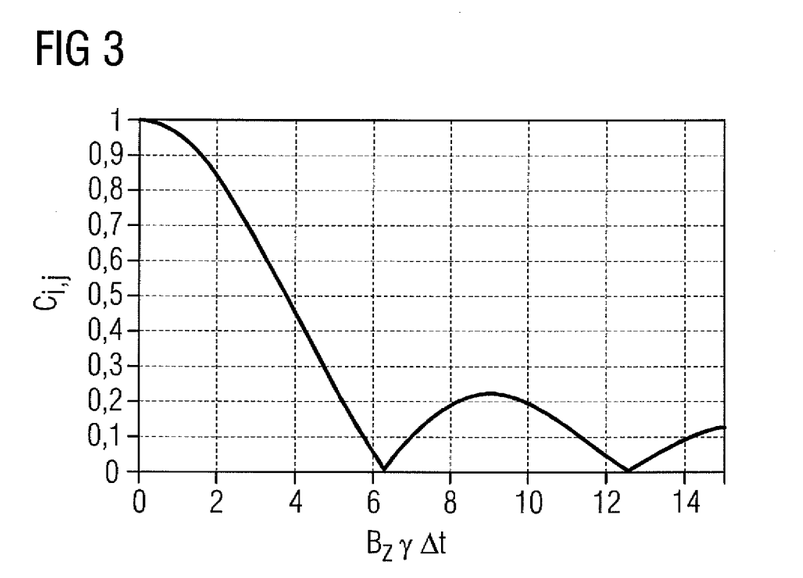
FIG. 3 shows a graphic representation of the correction factor $C_{ij}$ as a function of the product of the gradient field strength and the length of the time steps.

FIG. 3 shows the absolute value of the correction factor $C_{ij}$ (standardized to a maximum value 1) depending on the product $B_z \gamma \Delta t$, where $B_z$, as described above, is the magnetic field produced by the gradients in the Z-direction. The factor $B_z \gamma \Delta t$ corresponds to the denominator of the correction factor $C_{ij}$ according to the equation (6), with the assumption that the location-dependent error of the $B_0$ field, i.e. $\Delta B_0(x_i)$, may be be zero.

As may be seen from FIG. 3, the correction factor $C_{ij}$ for the value $B_z \gamma \Delta t = 0$ is 1 (i.e. the equation (5) corresponds to the conventional equation (2)). This is understandable if either the sampling time Δt is infinitely small or no gradient field $B_z$ is present. The correction factor $C_{ij}$ then decreases sharply and has a minimum of 0 at $B_z \gamma \Delta t = 2\pi$, as well as a further minimum at approximately $B_z \gamma \Delta t = 4\pi$. Between these two minimum values is a small maximum of approximately 0.2 at approximately $B_z \gamma \Delta t = 3\pi$. This is due to the fact that the function shown in the figure (as desired) represents the bandwidth of a square pulse, which is determined by the Fourier Transform of the square.

If an optimization of the target function is carried out according to the equation (4) by using the elements $a_{ij}$ of the Jacobi matrix J according to the equation (5) with the correction factors $C_{ij}$ according to the equation (6), the magnetization errors shown in the magnetization board a1 in FIG. 4 may be eliminated. This is shown by comparing the magnetization boards b2 and b1 with the boards a2 and a1. a2 is again the magnetization which should be theoretically achieved based on the linear approximation using the present embodiments. The determined theoretical HF pulses are then tested in a Bloch simulation to obtain the magnetization board b1. This magnetization board clearly shows that the result achievable in the Bloch simulation and, thus, the result actually achieved, coincides perfectly with the assumed result during optimization in the linear approximation.

The different magnetization boards in FIG. 4 show very clearly, therefore, that by considering the bandwidth of the individual partial pulses of an HF pulse in an optimization method using linear approximation, good results may be achieved even with greater gradient field strengths and greater sampling times Δt. The bandwidth of the individual partial pulses of an HF pulse may be considered using a simple correction factor. This correction makes it possible to use longer sampling times, in order to produce complex multi-channel pulses, while at the same time reducing overall computing time. Additionally or alternatively, steeper gradients may also be used to transit more rapidly the k-space and to shorten the measuring times.

Finally, it should also be mentioned that the method, systems, and devices described in detail herein are exemplary embodiments and that the basic principle may also be varied to a large extent by the person skilled in the art, without departing from the scope of the invention, provided it is set forth in the claims. In particular in the course of the HF pulse optimization method, further parameters may be optimized, such as global and/or local high frequency loads of the patient, amongst other things. For the sake of completeness, it should also be mentioned that the use of the indefinite article "a" does not preclude the possibility that the relevant features may also be present repeatedly. Similarly, the term "unit" does not preclude the possibility that said unit is a plurality of components which optionally may also be spread out in spatial terms.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a magnetic resonance system control sequence, the magnetic resonance system control sequence comprising a multi-channel pulse with a plurality of individual high frequency (HF) pulses to be transmitted in parallel by a magnetic resonance system via different independent high-frequency transmission channels, the method comprising:
   calculating, with a processor, a multi-channel pulse based on an MR excitation quality parameter in an HF pulse optimization method, wherein an HF pulse comprises a plurality of successive HF partial pulses in discrete time steps; and
   considering, in the HF pulse optimization method, a transmission bandwidth of an HF partial pulse to be transmitted during a discrete time step.

2. The method as claimed in claim 1, further comprising using a target function in the HF pulse optimization method,
   wherein the target function includes a magnetization that is achieveable by a multi-channel pulse, and the magnetization is represented by using a Taylor approximation of a Bloch equation for the magnetization.

3. The method as claimed in claim 2, wherein the considering comprises using a correction factor ($C_{ij}$) to form each matrix element of a Jacobi matrix used in the Taylor approximation, and
   wherein the correction factor ($C_{ij}$) represents the transmission bandwidth in a defined time step for a defined spatial magnetization location.

4. The method as claimed in claim 3, further comprising determining the correction factor ($C_{ij}$) according to the following equation:

$$C_{ij} = \frac{2\sin\lfloor((x_i g_j) + \Delta B_0(x_i)) \cdot \gamma \Delta t / 2 \rfloor}{((x_i g_j) + \Delta B_0(x_i)) \cdot \gamma \Delta t},$$

wherein $x_i$ is the local vector of a voxel i of an excitation volume, $g_j$ is the magnetic field gradient for the time step j, Δt is the temporal length of a discrete time step, $\Delta B_0$ is an error of the magnetic field at the location $x_j$, and γ is the gyromagnetic moment.

5. The method as claimed in claim 1, further comprising predetermining, as input data in the HF pulse optimization method, a current $B_0$-Map and a current $B_1$-Map for each respective transmission channel.

6. The method as claimed in claim 2, further comprising predetermining, as input data in the HF pulse optimization method, a current $B_0$-Map and a current $B_1$-Map for each respective transmission channel.

7. The method as claimed in claim 3, further comprising predetermining, as input data in the HF pulse optimization method, a current $B_0$-Map and a current $B_1$-Map for each respective transmission channel.

8. The method as claimed in claim 4, further comprising predetermining, as input data in the HF pulse optimization method, a current $B_0$-Map and a current $B_1$-Map for each respective transmission channel.

9. The method as claimed in claim 1, wherein the MR excitation quality parameter comprises a target magnetization.

10. The method as claimed in claim 2, wherein the MR excitation quality parameter comprises a target magnetization.

11. The method as claimed in claim 3, wherein the MR excitation quality parameter comprises a target magnetization.

12. The method as claimed in claim 4, wherein the MR excitation quality parameter comprises a target magnetization.

13. The method as claimed in claim 5, wherein the MR excitation quality parameter comprises a target magnetization.

14. A method for operating a magnetic resonance system comprising a plurality of independent high-frequency transmission channels, the method comprising:
  determining a magnetic resonance system control sequence, the magnetic resonance system control sequence comprising a multi-channel pulse with a plurality of individual high frequency (HF) pulses to be transmitted in parallel by a magnetic resonance system via different independent high-frequency transmission channels, wherein the determining comprises:
    calculating a multi-channel pulse based on an magnetic resonance (MR) excitation quality parameter in an HF pulse optimization method, wherein an HF pulse comprises a plurality of successive HF partial pulses in discrete time steps; and
    considering, in the HF pulse optimization method, a transmission bandwidth of an HF partial pulse to be transmitted during a discrete time step; and
  using the determined magnetic resonance system control sequence to operate the magnetic resonance system.

15. A control sequence determination device for determining a magnetic resonance system control sequence, the magnetic resonance system control sequence comprising a multi-channel pulse with a plurality of individual pulses to be transmitted in parallel by a magnetic resonance system via different independent high-frequency transmission channels, the device comprising:
  an input interface for detecting a magnetic resonance (MR) excitation quality parameter;
  a pulse optimization unit configured to calculate a multi-channel pulse based on a predetermined MR excitation quality parameter in a pulse optimization method, wherein a pulse comprises a plurality of successive partial pulses in discrete time steps; and
  a control sequence output interface,
  wherein the control sequence determination device is configured to consider, in the pulse optimization method, a transmission bandwidth of a partial pulse to be transmitted during a discrete time step.

16. A magnetic resonance (MR) system comprising:
  a plurality of independent high-frequency (HF) transmission channels;
  a gradient system;
  a control device configured to transmit a multi-channel pulse comprising a plurality of parallel individual high-frequency(HF) pulses configured to carry out a desired measurement based on a predetermined control sequence via the different high-frequency transmission channels; and
  a control sequence determination device for determining a magnetic resonance system control sequence, the magnetic resonance system control sequence comprising the multi-channel pulse with the plurality of parallel individual HF pulses to be transmitted in parallel by a magnetic resonance system via different independent high-frequency transmission channels, the device comprising:
    an input interface for detecting an MR excitation quality parameter;
    an HF pulse optimization unit configured to calculate the multi-channel pulse based on a predetermined MR excitation quality parameter in an HF pulse optimization method, wherein an HF pulse comprises a plurality of successive HF partial pulses in discrete time steps; and
    a control sequence output interface,
  wherein the control sequence determination device is configured to consider, in the HF pulse optimization method, a transmission bandwidth of an HF partial pulse to be transmitted during a discrete time step, and
  wherein the control sequence determination device is configured to transfer the determined magnetic resonance system control sequence to the control device.

17. A non-transitory computer-readable storage medium comprising a program having instructions executable by a control sequence determination device to determine a magnetic resonance system control sequence, the magnetic resonance system control sequence comprising a multi-channel pulse with a plurality of individual high frequency (HF) pulses to be transmitted in parallel by a magnetic resonance system via different independent high-frequency transmission channels, the instructions comprising:
  calculating a multi-channel pulse based on an magnetic resonance (MR) excitation quality parameter in an HF pulse optimization method, wherein an HF pulse comprises a plurality of successive HF partial pulses in discrete time steps; and
  considering, in the HF pulse optimization method, a transmission bandwidth of an HF partial pulse to be transmitted during a discrete time step.

\* \* \* \* \*